United States Patent [19]
Fujita et al.

[11] Patent Number: 5,380,609
[45] Date of Patent: Jan. 10, 1995

[54] METHOD FOR FABRICATING PHOTOMASKS HAVING A PHASE SHIFT LAYER COMPRISING THE USE OF A POSITIVE TO NEGATIVE RESIST, SUBSTRATE IMAGING AND HEATING

[75] Inventors: Hiroshi Fujita; Masaaki Kurihara, both of Tokyo, Japan

[73] Assignee: Dai Nippon Printing Co., Ltd., Tokyo, Japan

[21] Appl. No.: 99,153

[22] Filed: Jul. 29, 1993

[30] Foreign Application Priority Data

Jul. 30, 1992 [JP] Japan .................................. 4-203436
Sep. 4, 1992 [JP] Japan .................................. 4-236890

[51] Int. Cl.⁶ .................................................. G03F 9/00
[52] U.S. Cl. .......................................... 430/5; 430/296; 430/322; 430/324; 430/325; 430/327; 430/328; 430/329; 430/330; 430/394
[58] Field of Search ............... 430/5, 296, 322, 324, 430/325, 327, 328, 329, 330, 394

[56] References Cited

U.S. PATENT DOCUMENTS 4,948,706 8/1990 Sugihara et al. .................... 430/313
5,244,759 9/1993 Pierrat .................................. 430/296

Primary Examiner—Steve Rosasco
Attorney, Agent, or Firm—Dellett and Walters

[57] ABSTRACT

The invention relates to a method for forming a resist pattern for dry etching a phase shifter layer in which a phase shifter pattern portion and a portion for protecting the surface of a light-blocking pattern are formed by a single photolithographic step. A light-blocking patter 40 is formed on a phase shifter layer 33, followed by the formation of a positive to negative image reversible resist thin film 41. A given region of the resist thin film 41 that includes a part of the unpatterned region thereof is exposed to ionizing radiation 42. Post-exposure baking for image reversal is carried out. Subsequently, the whole back side of the substrate is exposed to ultraviolet light 44 using the light-blocking pattern as a mask, thereby enabling only an unexposed region of the unpatterned resist to be soluble in a developer. The resist thin film 41 is developed to form a resist pattern 45.

7 Claims, 6 Drawing Sheets

METHOD FOR FABRICATING PHOTOMASKS HAVING A PHASE SHIFT LAYER COMPRISING THE USE OF A POSITIVE TO NEGATIVE RESIST, SUBSTRATE IMAGING AND HEATING

BACKGROUND OF THE INVENTION

The present invention relates to a method for fabricating photomasks used for the production of high-density integrated circuits such as LSIs, VLSIs, etc., and more particularly to a method for fabricating a photomask having a phase shift layer that is used for forming fine patterns with high accuracy.

Semiconductor integrated circuits such as ICs, LSIs and VLSIs are now fabricated by repeating the so-called lithographic process wherein a resist is coated on the substrate to be processed, like a silicone wafer, and exposed to a desired pattern through a stepper, etc., followed by development, etching, doping, CVD, etc.

A photomask used for such a lithographic process and called a reticle is now increasingly required to have much higher accuracy in association with the high performance and high integration of semiconductor integrated circuits. Referring to a typical LSI, i.e., a DRAM by way of example, a 5×reticle for an 1 megabit DRAM, i.e., a reticle of a size five times as large as that of an exposure pattern should be very small in terms of dimensional variation; the accuracy demanded is as small as 0.15 $\mu$m even at the mean value $\pm 3\sigma$ ($\sigma$ is the standard deviation). Likewise, a dimensional accuracy of 0.1 to 0.15 $\mu$m is demanded for five-fold reticles for 4 megabit DRAMs; a dimensional accuracy of 0.05 to 0.1 $\mu$m for five-fold reticles for 16 megabit DRAMs; and a dimensional accuracy of 0.03 to 0.07 $\mu$m for five-fold reticles for 64 megabit DRAMs.

In addition, the line widths of device patterns formed with the use of these reticles are now becoming finer; for instance, they must be 1.2 $\mu$m for 1 megabit DRAMs, 0.8 $\mu$m for 4 megabit DRAMs, 0.6 $\mu$m for 16 megabit DRAMs, and 0.35 $\mu$m for 64 megabit DRAMs. To meet such demands, various lithographic technologies are now under investigation.

In the case of the next generation device patterns of the 64 megabit DRAM class for instance, however, the use of stepper lithographic technologies using conventional reticles will place some limit on resolving the resist patterns. To exceed this limit, a phase shift reticle, designed on the basis of a new technological paradigm, has been proposed in the art, as set forth in JP-A-58-173744, JP-B-62-59296, etc. Phase shift lithography making use of this phase shift reticle provides improved to be resolution and contrast of a projected image to be transmitted by manipulation of the phase of light transmitting through the reticle.

Phase shift lithography will now be explained briefly with reference to FIGS. 2 and 3. FIG. 2 is a schematic of the principle of the phase shift process, and FIG. 3 is a schematic of a conventional process. FIGS. 2(a) and 3(a) are sectional views of the reticles used, FIGS. 2(b) and 3(b) represent the amplitude of light transmitting through the reticles, FIGS. 2(c) and 3(c) illustrate the amplitude of light on the wafers, and FIGS. 2(d) and 3(d) show the intensity of light on the wafers. Reference numeral 1 indicates substrate, 2 a light-blocking layer, 3 a phase shifter, and 4 incident light.

In the conventional arrangement, the substrate 1 made up of glass or other material is simply provided with the light-blocking layer 2 for the purpose of defining a light transmitting portion according to a given pattern, as shown in FIG. 3(a). In the phase shift lithographic arrangement, however, the phase shifter 3 that is made up of a light transmitting film is provided on a part of neighboring light transmitting regions on the reticle for the purpose of inducing phase reversal (with a phase difference of 180°), as shown in FIG. 2(a). In the conventional process, therefore, the amplitude of light on the reticle is in the same phase, as shown in FIG. 3(b), and so is the amplitude of light on the wafer, as shown in FIG. 3(c). In other words, it is impossible to separate the resist patterns on the wafer from each other. In the case of phase lithography, in contrast, the light passing through the phase shifter is in opposite phase between neighboring patterns, as can be seen from FIG. 2(b), so that the intensity of light can be zero at the boundary of the adjacent patterns, and this enables the neighboring patterns to be distinctly separated from each other, as can be seen from FIG. 2(d). Thus, phase lithography makes it possible to separate patterns which, until now, could not be separated from each other, resulting in an improvement in resolution.

Various phase shift masks having such a phase shift layer have so far been studied in the art, and each has merits and disadvantages. Here conventional fabrication photosteps will be explained with reference to the Shibuya-Levenson type that is found to have the greatest effect on improving the critical resolution.

One typical example of the conventional process of fabricating phase shift reticles will now be explained with reference to FIGS. 4(a)-4(m) is a sectional schematic of the photosteps of fabricating a phase shift reticle of the type wherein a phase shifter layer lies over a metal thin film structure for light blocking purposes, this type having some relation to claim 2 of the appended claims. In FIGS. 4(a)-4(m), reference numeral 11 indicates a substrate, 12 a metal thin film layer for blocking light, 13 a resist layer, 14 ionizing radiation, 15 a resist pattern, 16 etching gas plasma, 17 a light-blocking metal thin film pattern, 18 oxygen plasma, 19 a phase shifter layer, 20 a resist layer, 21 ionizing radiation, 22 a resist pattern, 23 gas plasma for etching the shifter layer, 24 a phase shifter pattern, and 25 oxygen plasma. As shown in FIG. 4(a), the optically polished substrate 11 is first provided with the metal thin film layer 12, and an ionizing radiation resist such as one made up of chloromethylated polystyrene is then uniformly coated thereon by spin coating or other suitable means. Subsequent drying-by-heating treatment gives the resist layer 13 about 0.1 to 0.2 $\mu$m thickness. The drying-by-heating treatment, although varying with the type of resist and the type of equipment used, is done at 80° to 180° C. for 20 to 60 minutes in the case of using an oven, and for about 1 to 30 minutes in the case of using a hot plate.

Then, as shown in FIG. 4(b), a pattern is drawn on the resist layer 13 by ionizing radiation 14 in a manner, using an electron beam exposure device or other equipment. Subsequently, the resist layer is developed with a developer containing an organic solvent such as ethyl cellosolve or ester as a main component, and rinsed with alcohol, etc., to form a resist pattern such as one shown at 15 in FIG. 4(c).

Subsequently and if required, heating and descumming are done to remove unnecessary residue and scum remaining on the edge or other portions of the resist pattern 15. Following this, as shown in FIG. 4(d), the unexposed or unpatterned region of the metal thin film layer 12 is etched dry with the etching gas plasma 16 to form the light-blocking metal thin film pattern 17. It is noted that the step of etching the metal thin film layer may be done wet in place of dry.

After this, as shown in FIG. 4(e), the resist pattern 15 is incinerated out by the oxygen plasma 18 to complete a photomask having the light-blocking layer 17 formed of the metal thin film layer, as shown in FIG. 4(f). It is noted that this step may be carried out by using solvent releasing in place of the incineration treatment using oxygen plasma.

Subsequently, this photomask is inspected and, if required, repaired, followed by washing. Thereafter, the phase shifter layer 19 is formed on the light-blocking layer, as shown in FIG. 4(g). As shown in FIG. 4(h), the ionizing radiation resist 20 is formed on the phase shifter layer 19 in the same manner as mentioned above, and, as shown in FIG. 4(i), alignment drawing for the pattern 17 is carried out with respect to the resist layer 20, using an electron beam exposure device or other equipment. The resist layer 20 is thereafter developed and rinsed to obtain a given resist pattern such as the one shown at 22 in FIG. 4(j).

If required, heating and descumming are done, after which, as shown in FIG. 4(k), the unexposed or unpatterned region of the phase shifter layer 19 is etched dry with the etching gas plasma 23 to form the phase shifter pattern 24. It is noted that the phase shifter pattern 24 may be formed by using wet etching instead of using dry etching with the etching gas plasma 23.

Then, the remaining resist is incinerated out by the oxygen plasma 25, as shown in FIG. 4(l).

Through the above-mentioned steps, a phase shift reticle having a phase shifter layer such as one shown at 24 in FIG. 4(m) can be completed.

In the above-mentioned conventional process for fabricating a phase shift reticle, the phase shifter is made by forming a resist layer on a phase shifter layer, conducting alignment for pattern drawing with the use of an electron beam exposure device or a laser lithography device, developing the resist layer, and dry etching the phase shifter layer, using the resist pattern as a mask. However, a problem with this process is that if a part of the chromium nitride oxide, etc., forming the light-blocking film pattern is left unmasked or unprotected, the surface of the phase shifter layer is then damaged. This problem occurs even when the phase shifter layer lies below the light-blocking metal thin film layer—which has some relation to claim 1 of the appended claims.

In particular, this defect is found in oxidized, nitrided and carbonized chromium films that are used for making the surface layers of light-blocking structures mainly used with photomasks less reflective to light. This problem may be solved, if the surface of a light-blocking layer remains protected during drying etching, as already proposed by the present applicant in JP-A-3-47850.

In carrying this out, however, two additional photolithographic steps are needed for pattern drawing and back exposure prior to dry etching the phase shifter layer, resulting in an increase in the number of the steps involved. The increase in the number of the steps possibly gives rise to another grave problem such as a throughput drop and a defect rate increase.

SUMMARY OF THE INVENTION

In view of the situations mentioned above, an object of the invention is to provide a more practical method for fabricating a photomask having a phase shift layer wherein, when forming a resist pattern for dry etching a phase shifter layer of a phase shift reticle, a phase shifter pattern portion and a portion for protecting the surface of a light-blocking pattern is formed by a single photolithographic step, thereby reducing the number of the photosteps used and so enabling a phase shift reticle of high accuracy and high quality to be well fabricated.

In view of the problems mentioned above, the inventor has successfully accomplished the present invention as a result of studies made to develop a method for fabricating phase shift reticles of high accuracy in a stable manner without making substantial modifications to existing processes of fabricating phase reticles.

For a better understanding of the invention, the case where a phase shifter layer lies below a light-blocking metal thin film layer will now be explained with reference to FIGS. 1(a)–1(n) that is a sectional schematic of the fabrication photosteps according to the invention.

As shown in FIG. 1(a), an optically polished quartz substrate 31 is provided with a layer 32 that behaves as an etching stopper when a phase shifter layer 33 is etched. On the etching stopper layer there is stacked the phase shifter layer 33, on which a metal thin film layer 34 that forms a light-blocking layer made up mainly of chromium, molybdenum, silicon, aluminum or the like is then formed. On the layer 34 there is provided a resist thin film 35.

Then, as shown in FIG. 1(b), a pattern is drawn on the resist thin film 35 with ionizing radiation 36, using an electron beam or laser exposure device, etc. The resist thin film 35 with the pattern drawn on it is developed to form a resist pattern 37, as shown in FIG. 1(c). Using this resist pattern 37 as a mask, the exposed metal thin film layer 34 is etched as by etching gas plasma 38, as shown in FIG. 1(d), and the remaining resist is incinerated out as by oxygen plasma 39, as shown in FIG. 1(e). The thus formed metal pattern is inspected and repaired to form a light-blocking pattern such as one shown at 40 in FIG. 1(f).

Then, as shown in FIG. 1(g), this substrate is coated thereon with a resist 41 of the image reversal. Here the term "image reversible resist" is understood to refer to such a resist as defined just below. If a portion of the resist is exposed to light, then that portion is made soluble in a developer—the positive type. This exposed portion, when subject to post-exposure baking (hereinafter PEB for short), is converted to a negative type insoluble in the developer. The unexposed portion is made soluble in the developer by full-exposure after PEB. As shown in FIG. 1(h), a pattern is drawn on the resist thin film 41 with ionizing radiation 42, using an electron beam or laser exposure device, while an alignment mark on the light-blocking pattern 40 is detected, and PEB is carried out for the purpose of image reversal, thereby generating a negative pattern latent image 43 in the resist thin film 41, as shown in FIG. 1(i).

As shown in FIG. 1(j), the substrate is exposed on the back side to ultraviolet light 44, so that the resist thin film 41 can be made soluble in a developer only at the unpatterned portion of the phase shifter layer 33 to be etched. As shown in FIG. 1(k), the resist 41 is then developed to make a resist pattern 45.

Using the thus prepared resist pattern 45 as a mask, an unmasked portion of the phase shifter layer 33 is etched by the etching gas plasma 46, as shown in FIG. 1(l), and following the completion of this etching, the remaining resist thin film 47 is incinerated out as by the oxygen plasma 48, as shown in FIG. 1(m), thereby making a reticle having the phase shifter pattern such as one shown at 49 in FIG. 1(n).

In the fabrication method mentioned above, for instance, a novolak resin base resist using naphthoquinonediazido-4-sulfonic acid ester as the photosensitive material may be used for the image reversible resist. To improve the photosensitivity of the resist and enable the sectional configuration of the pattern after resist development to be made vertical, however, it is preferable to blend 0.2 to 15% by weight of polyethylene glycol with this resist. It is also preferable that the resist thin film obtained after resist coating is coated with, or dipped in, polyethylene glycol for exposure to ionizing radiation.

As a result of studies made by the inventor so as to obtain a positive and negative resist, it has now been found that an image reversible, positive and negative resist can be made by treating a chemical amplification type resist with alkali after exposure to neutralize the acid generated, and then exposing the whole surface of a substrate to ionizing radiation.

More specifically, when a positive type of chemical amplification resist is patterned with ionizing radiation after coating, an acid is generated from an acid generator in the exposed region. Then, as the substrate is subjected to PEB, the resist is converted by the generated acid to a form that is soluble in a developer, thus making pattern formation possible. This is a usual pattern lithography process. Here the resist is patterned with ionizing radiation for acid generation, and then exposed to an alkaline atmosphere such as one containing ammonia to neutralize the generated acid. Subsequently, the resist is rinsed as by water to wash away excess alkali. Upon the whole surface of the resist being exposed to ionizing radiation, the acid is generated from a region other than the initially patterned region. By subjecting this region to PEB, it is converted to a form that is soluble in a developer, so making image reversal possible.

This also holds for a negative resist; an acid generated from an acid emitter is neutralized with an alkali, excess alkali is washed away by rinsing as with water, the whole surface of the resist is exposed to ionizing radiation to generate an acid at a region other than the initially patterned region, and PEB is done to crosslink that region, so making image reversal possible.

In the invention, it is also possible to use such a positive type of chemical amplification resist as the image reversible resist. By way of example, a positive type of chemical amplification resist is composed of three components, an acid emitter, a dissolution inhibitor, and novolak resin. For instance, RE5100P made by Hitachi Kasei K.K. may be used to this end. Here the drying-by-heating treatment may take place at about 80° C. for about 10 minutes, and the ionizing radiation used for exposure may comprise electron beams, ultraviolet rays, etc. For the next treatment with alkali, ammonia vapor may be used, and the subsequent PEB may take place at about 80° C. for about 5 minutes. PEB is followed by exposure of the back side of the substrate to ionizing radiation, and ultraviolet rays may be used to this end. For development, use may be made of tetramethylammonium hydroxide or sodium phosphate.

It is understood that the fabrication method of the invention mentioned above may be equally applicable to the case where the phase shifter layer lies over the light-blocking metal thin film layer.

As can be seen from the foregoing, one aspect of the invention is directed to a method for fabricating a photomask having a phase shift layer, in which a transparent substrate is provided thereupon with a phase shifter pattern and a light-blocking pattern in this order, characterized by:

forming the light-blocking pattern on a phase shifter layer, followed by the formation of a positive to negative image reversible resist thin film, exposing to ionizing radiation a given region of the resist thin film that includes a part of the unpatterned region thereof, carrying out post-exposure baking for image reversal, exposing the whole back side of the substrate to ultraviolet light using the light-blocking pattern as a mask, thereby enabling only an unexposed region of the unpatterned resist to be soluble in a developer, developing the resist thin film to form a resist pattern, and using the resist pattern as a mask to etch an unmasked region of the phase shifter layer, whereby the phase shifter pattern is formed.

Another aspect of the invention is directed to a method for fabricating a photomask having a phase shift layer in which a transparent substrate is provided with a light-blocking pattern and a phase shifter pattern in this order, characterized by:

forming the light-blocking pattern on the substrate, followed by the formation of a phase shifter layer to form the phase shifter pattern, forming a positive to negative image reversible resist thin film, exposing to ionizing radiation a given region of the resist thin film that includes a part of the unpatterned region thereof, carrying out post-exposure baking for image reversal, exposing the whole back side of the substrate to ultraviolet light using the light-blocking pattern as a mask, thereby enabling only an unexposed region of the unpatterned resist to be soluble in a developer, developing the resist thin film to form a resist pattern, and using the resist pattern as a mask to etch an unmasked region of the phase shifter layer, whereby the phase shifter pattern is formed.

In either case, the phase shifter pattern may be formed by etching the quartz substrate.

In the fabrication method mentioned above, for instance, a novolak resin base resist using naphthoquinonediazido-4-sulfonic acid ester as the photosensitive material may be used for the image reversal of resist thin film. To improve the photosensitivity of the resist and enable the sectional configuration of the pattern after resist development to be made vertical, however, it is preferable to blend 0.2 to 15% by weight of polyethylene glycol with this resist. It is also preferable that the resist thin film obtained by resist coating is coated with, or dipped in, polyethylene glycol for exposure to ionizing radiation.

A positive type of chemical amplification resist may also be used as the positive to negative image reversal of resist thin film.

In the invention, a positive to negative image reversal of resist is used as the resist for etching the phase shifter. Thus, a given region of the resist thin film that includes a part of the unpatterned region thereof is exposed to ionizing radiation, the whole back side of the substrate is exposed to ultraviolet light using the light-blocking pattern as a mask, thereby enabling only an unexposed region of the unpatterned resist to be soluble in a developer, the resist thin film is developed to form a resist pattern, and the resist pattern is used as a mask to etch an unmasked region of the phase shifter layer. Since the light-blocking layer is left protected during etching, it is likely that its surface may be damaged. It is also possible to reduce the number of the photosteps used and achieve some considerable defect rate reduction, thus enabling a phase shift reticle of high accuracy and high quality to be well fabricated.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

Figure 1:
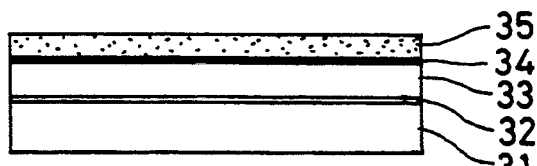
FIGS. 1(a)–1(n) A and 1B is a sectional schematic that illustrates the photosteps of the method for fabricating the photomask having a phase shift layer according to the invention.
Figure 1:
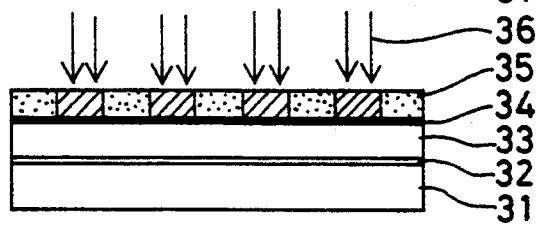
Figure 1:
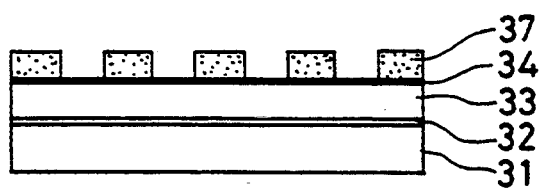
Figure 1:
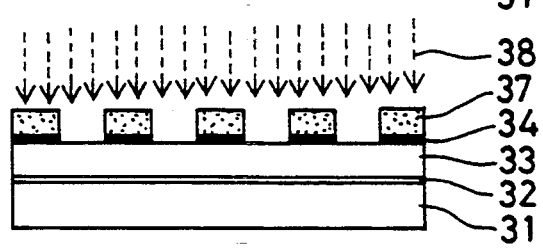
Figure 1:
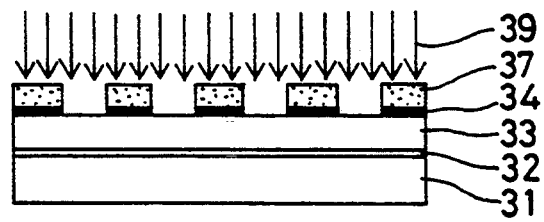
Figure 1:
Figure 1:
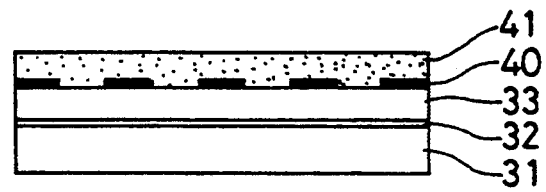
Figure 1:
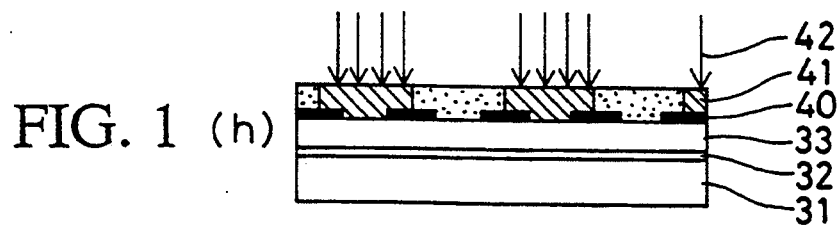
Figure 1:
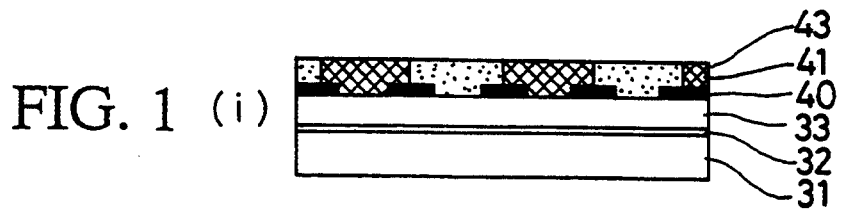
Figure 1:
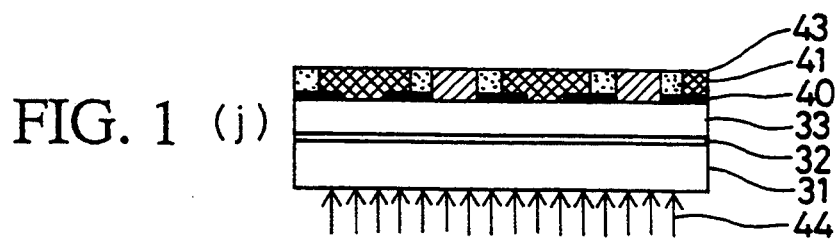
Figure 1:
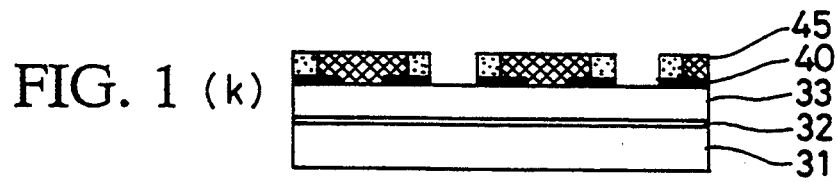
Figure 1:
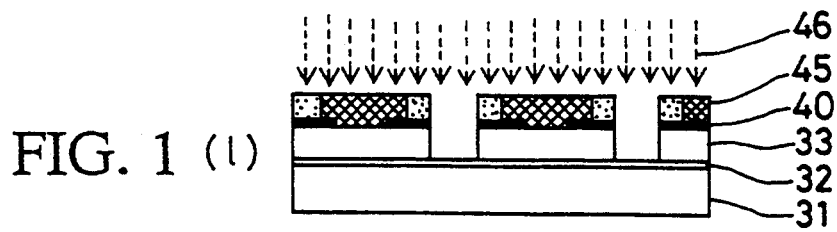
Figure 1:
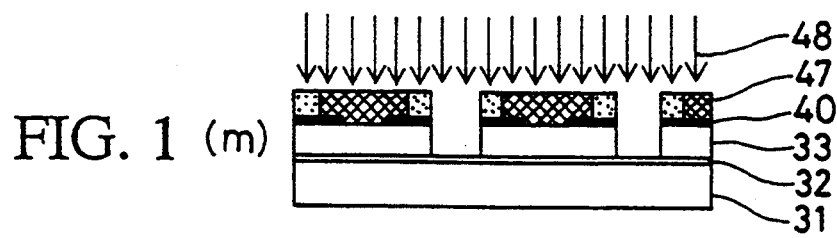
Figure 1:
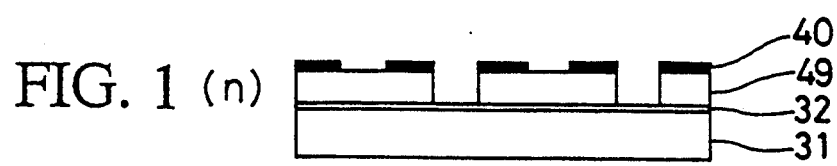
Figure 2:
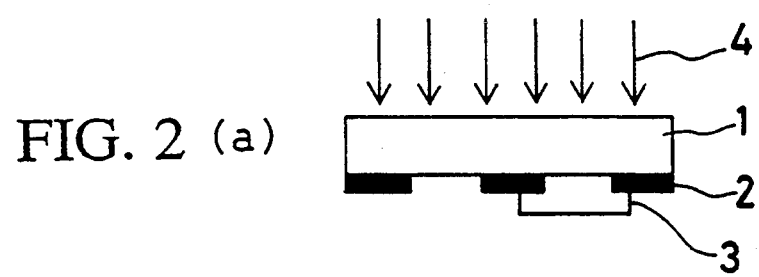
FIGS. 2(a)–2(d) is a schematic that illustrates the principle of a phase shift process.
Figure 2:
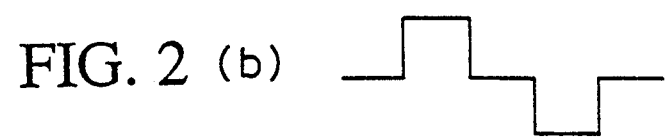
Figure 2:
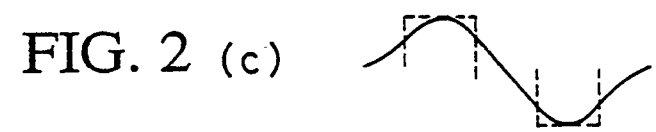
Figure 2:
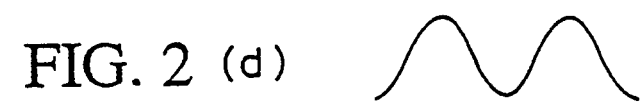
Figure 3:
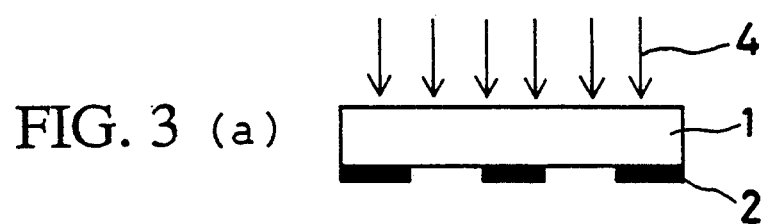
FIGS. 3(a)–3(d) is a schematic that represents a conventional process.
Figure 3:
Figure 3:
Figure 3:
Figure 4:
FIGS. 4(a)–4(m) is a sectional schematic that represents the steps of a conventional process of fabricating a phase shift photomask.
Figure 4:
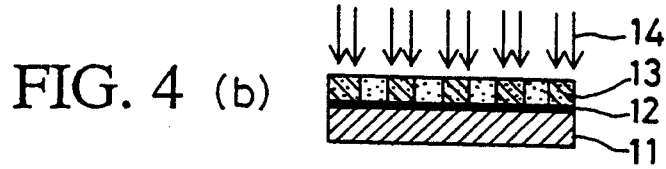
Figure 4:
Figure 4:
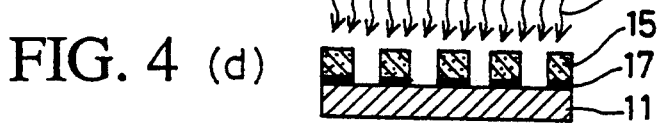
Figure 4:
Figure 4:
Figure 4:
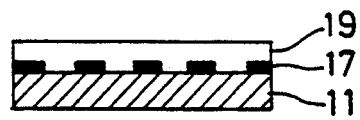
Figure 4:
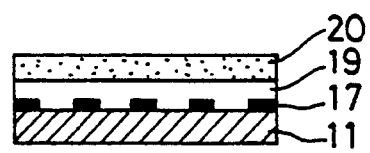
Figure 4:
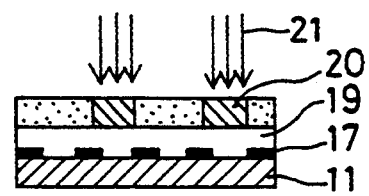
Figure 4:
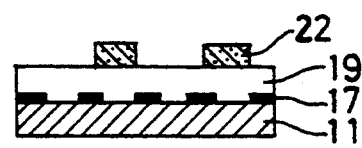
Figure 4:
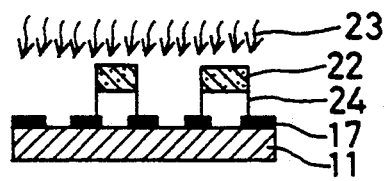
Figure 4:
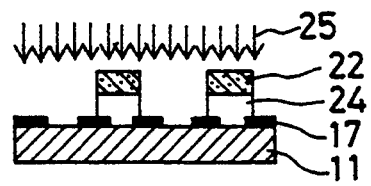
Figure 4:
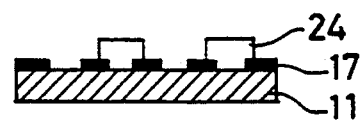

In the ensuing description, the method for fabricating a photomask having a phase shift layer according to the invention will be explained, more specifically but not exclusively, with reference to some examples.

EXAMPLE 1

An etching stopper layer made up of an about 100-nm thick alumina thin film was sputter-deposited on an optically polished, ultra-high-purity synthetic quartz glass substrate of 5 cubic inches and 0.09 inches in thickness, and SOG (spin-on glass) was coated on the stopper layer by spin coating, followed by drying-by-heating. In this way, a phase shifter layer made up of an about 400-nm thick SOG was formed. The drying-by-heating treatment was done at 90° C. for 30 minutes, at 150° C. for 30 minutes, and at 400° C. for 60 minutes. The thickness, $d_{SOG}$, of that SOG film then conforms to $$[\lambda/\{2(n-1)\}]\times 0.9 \leq d_{SOG} \leq [\lambda/\{2(n-1)\}]\times 1.1$$

where $\lambda$ is the exposure wavelength and n is the index of refraction of SOG at the exposure wavelength.

The substrate having thereon the phase shifter layer made up of SOG was further provided by sputtering with an about 100-nm thick thin film of metallic chromium and an about 10 to 20-nm thick thin film of chromium nitride oxide, thereby forming a two-layer film structure. Then, an electron beam resist EBR-9 was coated on that substrate by spin coating, and thermally treated at 200° C. for 30 minutes to obtain a uniform resist thin film of 500 nm in thickness.

Subsequently, the substrate was patterned in a conventional manner using an electron beam exposure device. The exposure was carried out at an acceleration voltage of 10 kV and an exposure dose of 5 $\mu C/cm^2$.

Following this, the resist thin film was developed with an organic solvent composed mainly of methyl isobutyl ketone and isopropyl alcohol, and then rinsed with isopropyl alcohol to form a resist pattern.

Then, a 30-minute post-exposure baking was done at 150° C. and a 3-minute descumming was carried out with oxygen plasma. After this, an unexposed or unpatterned region of the light-blocking layer made up of the two layers of chromium nitride oxide and metallic chromium were wet-etched with an ammonium solution of cerium (IV) nitrate, and the remaining resist was incinerated out by oxygen plasma to complete a light-blocking pattern.

Subsequently, this pattern was inspected and corrected with usual equipment available for photomasks. After washing, an image reversible resist (AZ-5200, Hext) was coated on the chromium pattern by spin coating techniques, and then dried by heating to make a 500-nm thick resist layer for masking the surfaces of the phase shifter and chromium patterns. The drying-by-heating treatment was done in an oven at 90° C. for 30 minutes.

Subsequently, alignment drawing was conducted in a conventional manner, using an ordinary laser exposure device. At this time, the exposure dose was 40 to 80 mJ/cm$^2$, calculated as i-lane. Thereafter, PEB for image reversal was done in an oven at 120° C. for 30 minutes.

Subsequently, while all the resist on the chromium pattern remained intact, the back side of the substrate was exposed to far-ultraviolet light with the aid of an ordinary contact exposure device, so that the unexposed resist on the chromium pattern, except the portion of the phase shifter pattern, the pattern image of which was converted by the post-drawing PEB to a negative tone, could be dissolved by development. The exposure dose was then 15 to 35 mJ/cm$^2$, calculated as far-ultraviolet light.

Subsequently, the resist was developed with an alkaline aqueous solution containing tetramethylammonium hydroxide as a main component, and then rinsed with pure water to form a resist pattern. Scanning electron microscopy reveals that the sectional configuration of this resist pattern is vertical.

Subsequently, the resist pattern was used to dry etch an unmasked portion of the phase shifter layer with an etching gas containing a fluorinated alkyl as a main component, and the remaining resist was removed with a resist stripper containing ethanol amine as a primary component to complete a reticle having a phase shift layer.

The thus finished phase shift reticle was of very high accuracy; the dimensional accuracy of the phase shifter was as small as 0.036 $\mu m$ at 3$\sigma$. Scanning electron microscopy indicated that there is no defect on the surface of chromium nitride oxide, and that the sectional configuration of the phase shifter is vertical.

EXAMPLE 2

An optically polished ultra-high-purity synthetic quartz glass substrate of 5 cubic inches and 0.09 inches in thickness was provided by sputtering with an about 100-nm thick thin film of metallic chromium and an about 10 to 20-nm thick thin film of chromium nitride oxide, thereby forming a two-layer film structure. Then, an electron beam resist EBR-9 was coated on that substrate by spin coating, and thermally treated at 200° C. for 30 minutes to obtain a uniform resist thin film of 500 nm in thickness.

Subsequently, the substrate was patterned in a conventional manner using an electron beam exposure device. The exposure was then carried out at an acceleration voltage of 10 kV and an exposure dose of 5 $\mu C/cm^2$.

Following this, the resist thin film was developed with an organic solvent composed mainly of methyl isobutyl ketone and isopropyl alcohol, and then rinsed with isopropyl alcohol to form a resist pattern.

Then, a 30-minute post-exposure baking was done at 150° C. and a 3-minute descumming was carried out with oxygen plasma. After this, an unexposed or unpatterned region of the light-blocking layer made up of the two layers of chromium nitride oxide and metallic chromium was etched wet with an ammonium solution of cerium (IV) nitrate, and the remaining resist was incinerated out by oxygen plasma to complete a light-blocking pattern.

Subsequently, this pattern was inspected and repaired with usual equipment for photomasks.

After washing, an image reversible resist (AX-5200, Hext) was coated on the chromium pattern by spin coating techniques, and then dried by heating to make a 500-nm thick resist layer for masking the surfaces of the phase shifter and chromium patterns. The drying-by-heating treatment was done in an oven at 90° C. for 30 minutes.

Subsequently, alignment drawing was conducted in conventional manners, using an ordinary laser exposure device. At this time, the exposure dose was 40 to 80 $mJ/cm^2$, calculated as i-lane. Thereafter, PEB for image reversal was done in an oven at 120° C. for 30 minutes.

Subsequently, while all the resist on the chromium pattern remained intact, the back side of the substrate was exposed to far-ultraviolet light with the aid of an ordinary contact exposure device, so that the unexposed resist on the chromium pattern, except the portion of the phase shifter pattern, the pattern image of which was converted by the post-drawing PEB to a negative tone, could be dissolved by development. The exposure dose was then 15 to 35 $mJ/cm^2$, calculated as far-ultraviolet light.

Subsequently, the resist was developed with an alkaline aqueous solution containing tetramethylammonium hydroxide as a main component, and then rinsed with pure water to form a resist pattern. Scanning electron microscopy revealed that the sectional configuration of this resist pattern is vertical.

Subsequently, an unpatterned region of the quartz substrate was etched dry by reactive ion etching making use of $CF_4$ gas to a depth conforming to $d = \lambda/2(n-1)$ where d is the etching depth, $\lambda$ is the exposure wavelength, and n is the index of refraction of the quartz substrate at the exposure wavelength, and the remaining resist was removed with a resist stripper containing ethanol amine as a primary component to complete a reticle having a phase shift layer.

The thus finished phase shift reticle was of very high accuracy; the dimensional accuracy of the phase shifter was as small as 0.036 $\mu m$ at $3\sigma$. Scanning electron microscopy indicated that there is no defect on the surface of chromium nitride oxide, and that the sectional configuration of the phase shifter is vertical.

COMPARATIVE EXAMPLE

An etching stopper layer made up of an about 100-nm thick alumina thin film was sputtered on an optically polished, ultra-high-purity synthetic quartz glass substrate of 5 cubic inches and 0.09 inches in thickness, and SOG was coated on the stopper layer by spin coating, followed by drying-by-heating. In this way, a phase shifter layer made up of an about 400-nm thick SOG was formed. The drying-by-heating treatment was done at 90° C. for 30 minutes, at 150° C. for 30 minutes, and at 400° C. for 60 minutes.

The substrate having thereon the phase shifter layer made up of SOG was further provided by sputtering with an about 100-nm thick thin film of metallic chromium and an about 10 to 20-nm thick thin film of chromium nitride oxide, thereby forming a two-layer film structure. Then, an electron beam resist EBR-9 was coated on that substrate by spin coating, and thermally treated at 200° C. for 30 minutes to obtain a uniform resist thin film of 500 nm in thickness.

Subsequently, the substrate was patterned in a conventional manner using an electron beam exposure device. The exposure was carried out at an acceleration voltage of 10 kV and an exposure dose of 5 $\mu C/cm^2$.

Following this, the resist thin film was developed with an organic solvent composed mainly of methyl isobutyl ketone and isopropyl alcohol, and then rinsed with isopropyl alcohol to form a resist pattern.

Then, a 30-minute post-exposure baking was done at 150° C. and a 3-minute descumming was carried out with oxygen plasma. After this, an unexposed or unpatterned region of the light-blocking layer made up of the two layers of chromium nitride oxide and metallic chromium was etched wet with an ammonium solution of cerium (IV) nitrate, and the remaining resist was incinerated out by oxygen plasma to complete a light-blocking pattern.

Subsequently, this pattern is inspected and repaired with usual equipment for photomasks. After washing, an i-lane positive type resist (THMR-iP1800; made by Tokyo Oka Kogyo K.K.) was coated on the chromium pattern by spin coating techniques, and then dried by heating to make a 500-nm thick resist layer for masking the surface of the phase shifter pattern. The drying-by-heating treatment was done in an oven at 90° C. for 30 minutes.

Subsequently, alignment drawing was conducted in conventional manners, using an ordinary laser exposure device. At this time, the exposure dose was 75 to 105 $mJ/cm^2$, calculated as i-lane.

Subsequently, the resist was developed with an alkaline aqueous solution containing tetramethylammonium hydroxide as a main component, and then rinsed with pure water to form a resist pattern.

Subsequently, a portion of the phase shifter layer that was not masked by the chromium light-blocking and resist patterns was etched dry with an etching gas composed mainly of a fluorinated alkyl for about 20 minutes, and the remaining resist was removed with a resist stripper composed mainly of ethanol amine to complete a reticle having a phase shift layer.

Scanning electron microscopy indicated that the thus completed phase shift reticle is virtually vertical in a section. However, the surface of chromium nitride oxide—that was left unmasked during the dry etching of the phase shifter layer—was found to have an increased reflectivity; in other words, that surface was damaged by etching gas plasma.

EXAMPLE 3

A chemical amplification positive type of resist, RE5100P made by Hitachi Kasei K.K., was coated on a chromium substrate to obtain a uniform resist film of 500 nm in thickness. Then, the resist film was patterned with electron beams at an acceleration voltage of 20 kV and an exposure dose of 2 $\mu C/cm^2$, after which the resist was exposed to an ammonia atmosphere prevailing over a vessel containing 1N aqueous ammonia for 10 minutes, and then rinsed with pure water. Subsequently, the whole surface of the resist was exposed to light coming from a low-pressure mercury lamp for 10 minutes, and thermally treated at 90° C. on a hot plate. Finally, the resist was developed with an 2.38% aqueous solution of tetramethyl-ammonium hydroxide for 8 minutes, and then rinsed with pure water for 60 seconds, whereby a negative pattern with a reversed image could be obtained.

As can be understood from what has been described with reference to the invention, a positive to negative image reversible type of resist is used as the resist for etching the phase shifter. Thus, a given region of the resist thin film that includes a part of the unpatterned region thereof is exposed to ionizing radiation, post-exposure baking is carried out for image reversal, the whole back side of the substrate is exposed to ultraviolet light using the light-blocking pattern as a mask, thereby enabling only a region of the unpatterned resist that was unexposed per the first ionizing radiation exposure and subsequently exposed by the ultraviolet light exposure to be soluble in a developer, the resist thin film is developed to form a resist pattern, and the resist pattern is used as a mask to etch an unmasked region of the phase shifter layer. Since the light-blocking layer is left protected during etching, it is unlikely that its surface will be damaged. It is also possible to reduce the number of the photosteps used and achieve some considerable defect rate reduction, thus enabling a phase shift reticle of high accuracy and high quality to be fabricated.

What we claim is:

1. A method for fabricating a photomask having a phase shift layer, in which a transparent substrate is provided thereon with a phase shifter pattern and a light-blocking pattern in this order, characterized by:
    forming the light-blocking pattern on a phase shifter layer, followed by the formation of a positive to negative image reversible resist thin film,
    exposing to ionizing radiation a given region of the resist thin film that includes a part of the unpatterned region thereof,
    carrying out post-exposure baking for image reversal,
    exposing the whole back side of the substrate to ultraviolet light using the light-blocking pattern as a mask, thereby enabling only a region of the unpatterned resist, as patterned per the first ionizing radiation exposure, that was not exposed during the first ionizing radiation exposure and was exposed during the ultraviolet light exposure, to be soluble in a developer,
    developing the resist thin film to form a resist pattern, and
    using the resist pattern as a mask to etch an unmasked region of the phase shifter layer, whereby the phase shifter pattern is formed.

2. A method for fabricating a photomask having a phase shift layer as claimed in claim 1, characterized in that said phase shifter pattern is formed by etching a quartz substrate.

3. A method for fabricating a photomask having a phase shift layer as claimed in any one of claims 1-2, characterized in that a novolak resin base resist using naphthoquinone-diazido-4-sulfonic acid ester as the photosensitive material is used for said positive to negative image reversible type resist.

4. A method for fabricating a photomask having a phase shift layer as claimed in claim 3, characterized in that said novolak resin base resist further contains 0.2 to 15% by weight of polyethylene glycol.

5. A method for fabricating a photomask having a phase shift layer as claimed in claim 3, characterized in that the resist thin film obtained after the coating of said novolak resin base resist is coated with, or dipped in, polyethylene glycol, followed by exposure to ionizing radiation, 6. A method for fabricating a photomask having a phase shift layer as claimed in any one of claims 1-2, characterized in that a positive type of chemical amplification resin is used as said positive to negative image reversible resist thin film.

7. A method for fabricating a photomask having a phase shift layer in which a transparent substrate is provided thereon with a light-blocking pattern and a phase shifter pattern in this order, characterized by:
    forming the light-blocking pattern on the substrate, followed by the formation of a phase shifter layer to form the phase shifter pattern,
    forming a positive to negative image reversible type resist thin film,
    exposing to ionizing radiation a given region of the resist thin film that includes a part of the unpatterned region thereof,
    carrying out post-exposure baking for image reversal,
    exposing the whole back side of the substrate to ultraviolet light using the light-blocking pattern as a mask, thereby enabling only a region of the unpatterned resist, as patterned per the first ionizing radiation exposure, that was not exposed during the first ionizing radiation exposure and was exposed during the ultraviolet light exposure, to be soluble in a developer,
    developing the resist thin film to form a resist pattern, and
    using the resist pattern as a mask to etch an unmasked region of the phase shifter layer, whereby the phase shifter pattern is formed.

* * * * *